US008120088B1

(12) United States Patent
She et al.

(10) Patent No.: US 8,120,088 B1
(45) Date of Patent: Feb. 21, 2012

(54) NON-VOLATILE MEMORY CELL AND ARRAY

(75) Inventors: Min She, Fremont, CA (US); Chih-Hsin Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 978 days.

(21) Appl. No.: 12/105,988

(22) Filed: Apr. 18, 2008

Related U.S. Application Data

(60) Provisional application No. 61/012,204, filed on Dec. 7, 2007.

(51) Int. Cl.
*H01L 29/76* (2006.01)

(52) U.S. Cl. ................................ 257/314; 257/E29.129

(58) Field of Classification Search .......... 257/314–326, 257/E29.129, E29.3, E21.68
See application file for complete search history.

(56) References Cited

U.S. PATENT DOCUMENTS 3,943,543 A 3/1976 Caywood
3,944,849 A 3/1976 Tasch, Jr. et al.
4,072,977 A 2/1978 Bate et al.
4,462,090 A 7/1984 Iizuka
4,698,787 A 10/1987 Mukherjee et al.
4,957,877 A 9/1990 Tam et al.
5,029,130 A 7/1991 Yeh
5,053,839 A 10/1991 Esquivel et al.
5,070,480 A 12/1991 Caywood
5,095,344 A 3/1992 Harari
5,115,289 A 5/1992 Hisamoto et al.
5,146,426 A 9/1992 Mukherjee et al.
5,153,880 A 10/1992 Owen et al.
5,161,157 A 11/1992 Owen et al.
5,235,544 A 8/1993 Caywood
5,268,319 A 12/1993 Harari
5,270,980 A 12/1993 Pathak et al.
5,280,446 A 1/1994 Ma et al.
5,286,994 A 2/1994 Ozawa et al.
5,426,316 A 6/1995 Mohammad
5,429,965 A 7/1995 Shimoji
5,432,739 A 7/1995 Pein
5,487,033 A 1/1996 Keeney et al.
5,517,044 A 5/1996 Koyama
5,523,243 A 6/1996 Mohammad
5,557,122 A 9/1996 Shrivastava et al.
5,559,735 A 9/1996 Ono et al.
5,563,083 A 10/1996 Pein
5,621,738 A 4/1997 Caywood et al.
5,679,591 A * 10/1997 Lin et al. ....................... 438/257
5,714,766 A 2/1998 Chen et al.
5,739,567 A 4/1998 Lipp et al.
5,764,096 A 6/1998 Lipp et al.
5,768,192 A 6/1998 Eitan
5,780,341 A 7/1998 Ogura
5,790,455 A 8/1998 Caywood (Continued)

OTHER PUBLICATIONS

Bock et al.; 3.3ps SiGe Bipolar Technology; Proceeding of the IEDM; pp. 255-258; 2004.

(Continued)

*Primary Examiner* — Tucker Wright

(57) ABSTRACT

Memory cells and arrays have reduced bit line resistance. An element conductor is disposed on the top of the bit line to reduce the resistance of the bit line while maintaining a shallow bit line junction so that 200 Ohm/square or lower sheet resistances are achieved with the bit line junctions typically 20 nanometers or shallower while the doping levels in the junctions are below about $5\times10^{19}$ atoms/$cm^3$.

36 Claims, 10 Drawing Sheets

20 3 22 5 X-axis Z-axis Y-axis 9 4-1 2-1 8 4-2 2-2 OFF-SET DISTANCE 7-1 6-1 11 1 70 10 7-2 6-2 6L

U.S. PATENT DOCUMENTS 5,792,670 A 8/1998 Pio et al.
5,822,242 A 10/1998 Chen
5,838,039 A 11/1998 Sato et al.
5,847,427 A 12/1998 Hagiwara
5,847,996 A 12/1998 Guterman et al.
5,883,409 A 3/1999 Guterman et al.
5,966,329 A 10/1999 Hsu et al.
5,973,356 A 10/1999 Noble et al.
6,002,152 A 12/1999 Guterman et al.
6,080,995 A 6/2000 Nomoto
6,088,263 A 7/2000 Liu et al.
6,091,104 A 7/2000 Chen
6,103,573 A 8/2000 Harari
6,104,057 A 8/2000 Nakanishi et al.
6,201,732 B1 3/2001 Caywood
6,211,562 B1 4/2001 Forbes et al.
6,303,940 B1 10/2001 Kizilyalli et al.
6,313,487 B1 11/2001 Kencke et al.
6,368,915 B1 4/2002 Kitamura et al.
6,372,617 B1 4/2002 Kitamura
6,384,451 B1 5/2002 Caywood
6,388,922 B1 5/2002 Fujiwara et al.
6,407,424 B2 6/2002 Forbes
6,411,545 B1 6/2002 Caywood
6,426,896 B1 7/2002 Chen
6,449,189 B2 9/2002 Mihnea et al.
6,451,652 B1 9/2002 Caywood et al.
6,469,343 B1 10/2002 Mura et al.
6,479,863 B2 11/2002 Caywood
6,503,785 B2 1/2003 Chen
6,525,371 B2 2/2003 Johnson
6,525,962 B1 2/2003 Pai et al.
6,531,731 B2 3/2003 Jones et al.
6,534,816 B1 3/2003 Caywood
6,555,865 B2 4/2003 Lee
6,566,706 B1 5/2003 Wang et al.
6,574,140 B2 6/2003 Caywood
6,580,124 B1 6/2003 Cleeves et al.
6,580,642 B1 6/2003 Wang
6,593,624 B2 7/2003 Walker
6,621,107 B2 9/2003 Blanchard et al.
6,680,505 B2 1/2004 Ohba et al.
6,709,928 B1 3/2004 Jenne et al.
6,721,205 B2 4/2004 Kobayashi et al.
6,727,545 B2 4/2004 Wang et al.
6,734,105 B2 5/2004 Kim
6,743,674 B2 6/2004 Wang
6,744,111 B1 6/2004 Wu
6,745,370 B1 6/2004 Segal et al.
6,747,310 B2 6/2004 Fan
6,753,568 B1 6/2004 Nakazato et al.
6,756,633 B2 6/2004 Wang et al.
6,774,433 B2 8/2004 Lee et al.
6,790,727 B2 9/2004 Jones et al.
6,791,883 B2 9/2004 Swift et al.
6,815,764 B2 11/2004 Bae et al.
6,847,556 B2 1/2005 Cho
6,853,583 B2 2/2005 Diorio et al.
6,861,698 B2 3/2005 Wang
6,873,006 B2 3/2005 Chen et al.
6,882,572 B2 4/2005 Wang et al.
6,894,339 B2 5/2005 Fan et al.
6,894,343 B2 5/2005 Harari et al.
6,897,514 B2 5/2005 Kouznetsov et al.
6,936,884 B2 8/2005 Chae et al.
6,936,887 B2 8/2005 Harari et al.
6,952,032 B2 10/2005 Forbes et al.
6,952,033 B2 10/2005 Kianian et al.
6,953,970 B2 10/2005 Yuan et al.
6,958,513 B2 10/2005 Wang
7,015,102 B2 3/2006 Wang
7,018,897 B2 3/2006 Wang
7,074,672 B2 7/2006 Kianian et al.
7,075,823 B2 7/2006 Harari
7,115,942 B2 10/2006 Wang
7,149,118 B2 12/2006 Diorio et al.
7,190,018 B2 3/2007 Chen et al.
7,259,984 B2 8/2007 Kan et al.
7,274,068 B2 9/2007 Forbes
7,297,634 B2 11/2007 Wang
7,307,308 B2 12/2007 Lee et al.
2001/0029077 A1 10/2001 Noble et al.
2002/0179958 A1 12/2002 Kim
2003/0032243 A1 2/2003 Ogura et al.
2004/0021170 A1 2/2004 Caywood
2004/0160824 A1 8/2004 Kianian et al.
2004/0214396 A1 10/2004 Wang et al.
2005/0167734 A1 8/2005 She et al.
2005/0247972 A1 11/2005 Forbes
2006/0001053 A1 * 1/2006 Wang ............................ 257/214
2006/0284236 A1 12/2006 Bhattacharyya
2006/0289924 A1 12/2006 Wang

OTHER PUBLICATIONS

Caywood, John M. et al; A Novel Nonvolatile Memory Cell Suitable for Both Flash and Byte-Writable Applications; IEEE Transactions on Electron Devices; vol. 49, No. 5; May 2002; pp. 802-807.

Fischetti et al.; Six-band k•p calculation of hole mobility in silicon inversion layers: Dependence on surface orientation, strain, and silicon thickness; Journal of Applied Physics, vol. 94;. pp. 1079-1095; 2003.

Hensel et al.; Cyclotron Resonance Experiments in Uniaxially Stressed Silicon: Valence Band Inverse Mass Parameters and Deformation Potentials; Physical Review; vol. 129, No. 3; Feb. 1, 1963; pp. 1141-1062.

Hinckley et al.; Hole transport theory in pseudomorphic Si1-x Gex allows grown on Si(001) substrates; Physical Review B; vol. 41, No. 5; Feb. 15, 1990; pp. 2912-2926.

Kitamura et al.; A Low Voltage Operating Flash Memory Cell with High Coupling Ratio Using Homed Floating Gate with Fine HSG; 1998 Sumposium on VLSI Technology Digest of Technical Papers; pp. 104-105.

Kuo et al.; TEFET—A High Density, Low Erase Voltage, Trench Flash EEPROM; 1994 Symposium on VLSI Technology Digest of Technical Papers; pp. 51-52.

Lai, Stefan; Flash Memories: Where We WEre and Where We Are Going; 1998 IEEE; pp. 971-973.

Lenzlinger et al.; Fowler-Nordheim Tunneling into Thermally Grown SiO; Journal of Applied Physics; vol. 40, No. 1; Jan. 1969; pp. 278-283.

Heiblum et al.; Direct Observation of Ballistic Transport in GaAs; Physical Review Letters; vol. 55, No. 20; Nov. 11, 1985; pp. 2200-2203.

Nicoilian et al.; MOS (Metal Oxide Semiconductor) Physics and Technology; "Photo I-V Method-Basics"; A Wiley-Interscience Publication; 1982; pp. 512-515.

Sze, S. M.; Physics of Semiconductor Devices (Second Edition); "Schottky Effect"; A Wiley-Intersciences Publication; 1981; pp. 250-253.

SMA5111—Compound Semiconductors; Lectur 2—Metal-Semiconductor Junction-Outline; C.G. Fonstad; Feb. 2003; 22 pp.

Vogelsang et al.; Electron Mobilities and High-Field Drift Velocity in Strained Silicon on Silicon-Germanium Substrate; IEEE Transactions on Electron Devices; vol. 39, No. 11; Nov. 1992; pp. 2641-2642.

Wang, Chih Hsin; Three-Dimensional DIBL for Shallow-Trench Isolated MOSFETs; IEEE Transactions on Electron Devices; vol. 46, No. 1; Jan. 1, 1999; pp. 139-144.

Mead, C.A.; The Tunnel-Emission Amplifier; Proceedings of the IRE; 1960; pp. 359-361.

Fujiwara et al.; High-Efficiency Programming with Inter-Gate Hot-Electron Injection for Flash EEPROM; Digest of Non-Volatile Semiconductor Memory Workshop; Feb. 2000; pp. 127-129.

First Examination Report from the State Intellectual Property Office of the People's Republic of China dated Aug. 30, 2008, for Chinese Application No. 2005/100804259; 9 pp.

First Examination Report from the State Intellectual Property Office of the People's Republic of China dated Sep. 6, 2007, for Chinese Application No. 2005/100804314; 8 pp.

Pein et al.; Performance of the 3-D Sidewall Flash EPROM Cell; IEDM Technical Digest; Dec. 1993; pp. 11-14.

* cited by examiner

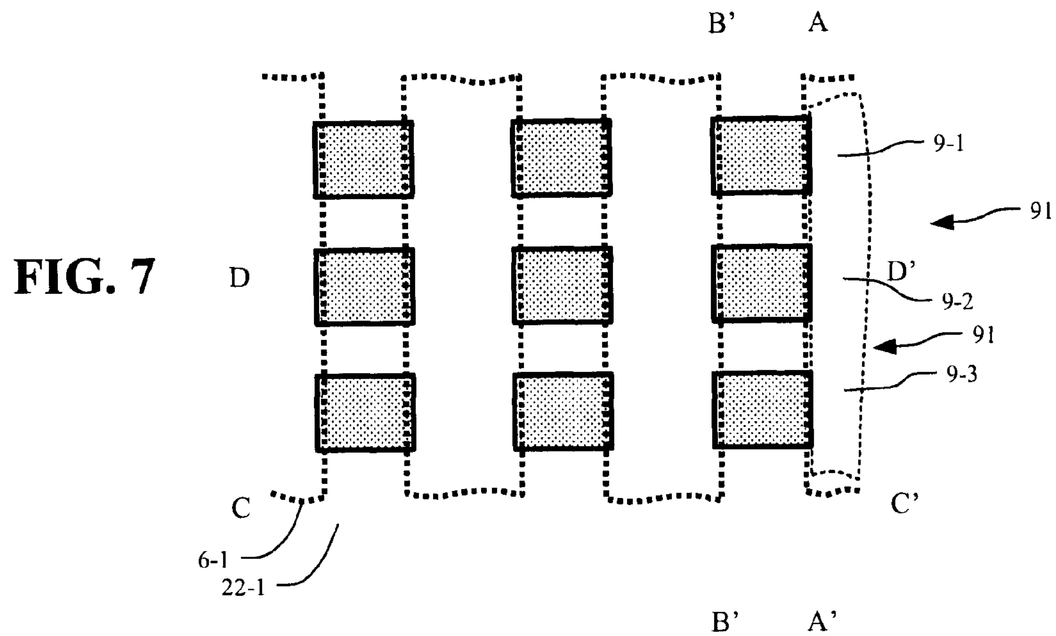
FIG. 7
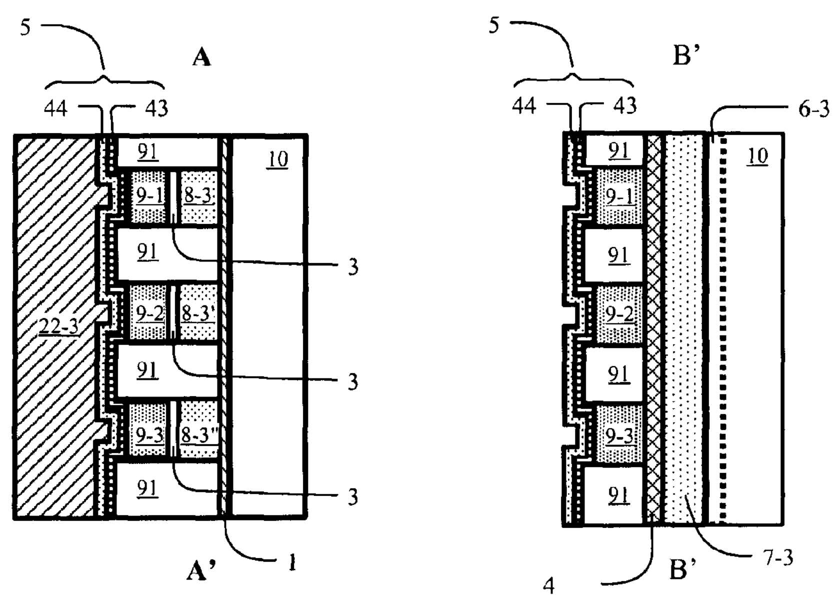
FIG. 8A
FIG. 8B

NON-VOLATILE MEMORY CELL AND ARRAY

CROSS-REFERENCED APPLICATIONS

This application claims the benefit under 35 USC 119(e) of Provisional Patent Application U.S. Ser. No. 61/012,204 entitled NON-VOLATILE MEMORY CELLS AND ARRAYS, filed Dec. 7, 2007; First Named Inventor: Min She. Application Ser. No. 61/012,204 is hereby incorporated by reference in its entirety in the present specification.

US Patent Application Publication having Pub. No. US 2006/0001053 A1, entitled METHOD AND APPARATUS TRANSPORTING CHARGES IN SEMICONDUCTOR DEVICE AND SEMICONDUCTOR MEMORY DEVICE, Pub. Date Jan. 5, 2006; Inventor Chih-Hsin Wang. Published Patent Application NO. US 2006/0001053 A1 is hereby incorporated by reference in its entirety in the present specification.

TECHNICAL FIELD

The present specification relates to semiconductor memory cells and semiconductor memory arrays and to methods for arranging such memory cells and arrays.

BACKGROUND

Non-volatile semiconductor memory arrays with memory cells having charge storage capability are well known in the art. Examples of such memory arrays are described in the cross-referenced application entitled METHOD AND APPARATUS TRANSPORTING CHARGES IN SEMICONDUCTOR DEVICE AND SEMICONDUCTOR MEMORY DEVICE.

In non-volatile memories, a typical bit line can be a number of millimeters long. The long bit line results in a large resistance if the bit line junction is not heavily doped and deep. With a large resistance, a large voltage drop occurs along the bit line in the presence of significant bit line current. Although a heavily doped and deep bit line junction can reduce the resistance, such a heavily doped and deep bit line junction causes serious short channel effects to the memory cell. There is a problem with and a trade-off between the bit line resistance and the short channel effects in non-volatile memories. To prevent the short channel effects for a gate length of 45 nanometers or below, the bit line junction is required to be as shallow as 20 nanometers and the doping level in the bit line junction is required not to exceed $5\times10^{19}$ atoms/cm$^3$. However, such shallow and lightly doped junction results in a sheet resistance of 1000 Ohms/square or higher.

In light of the above background, there is a need for improved memory cells, improved arrays and improved steps for arranging memory cells and arrays.

Other objects and further understanding of the objects will be realized by referencing to the specification and drawings.

SUMMARY

Embodiments of the present specification are semiconductor memory cells including a first element, a second element and a channel between the first element and the second element in a body where the first element and the second element extend in a first direction with a charge storage region juxtaposed the channel. One or more element conductors are juxtaposed the first element and/or the second element and extend in the first direction. A line conductor is juxtaposed the charge storage region and extends in a second direction normal to the first direction. A line insulator insulates the one or more element conductors from the line conductor.

In embodiments of the present specification, memory cells, and arrays formed of the memory cells, have reduced bit line (first and second element) resistance. An element conductor is juxtaposed (on the top of) the bit line to reduce the resistance of the bit line while maintaining a shallow bit line junction. In such embodiments, 200 Ohm/square or lower sheet resistances are achieved with the bit line junctions typically 20 nanometers or shallower while the doping levels in the junctions are below about $5\times10^{19}$ atoms/cm$^3$.

In particular embodiments of the present specification, the charge storage region comprises polysilicon.

In particular embodiments of the present specification, the charge storage region has a height in a range from approximately 10 nanometers to approximately 120 nanometers.

In particular embodiments of the present specification, the charge storage region comprises a plurality of spaced-apart nanoparticles. The nanoparticles comprise material selected from the group consisting of Si, Ge, $HfO_2$, Au, Ag, Pt, combinations thereof and alloys thereof. The nanoparticles include nanoparticles having diameters in a range from approximately 5 nanometers to approximately 20 nanometers.

In particular embodiments of the present specification, the charge storage region comprises a dielectric having a plurality of trapping centers. The dielectric comprises material selected from the group consisting of silicon nitride (SiN), hafnium oxide ($HfO_2$), oxynitride, combinations thereof and alloys thereof.

In particular embodiments of the present specification, a channel insulator is between the channel and the charge storage region.

In particular embodiments of the present specification, an element conductor insulator is between the one or more element conductors and the charge storage region.

In particular embodiments of the present specification, a line conductor insulator is between the line conductor and the charge storage region, a first insulator is between the channel and the charge storage region, a second insulator is between the one or more element conductors and the charge storage region and a third insulator is between the line conductor and the charge storage region. In various embodiments, two or more of the first insulator, the second insulator and the third insulator are formed of the same material; one or more of the first insulator, the second insulator and the third insulator are formed of one or more layers of insulating material; and one or more of the first insulator, the second insulator and the third insulator are formed of one or more layers of material selected from the group consisting of oxide, nitride, oxynitride, combinations thereof and alloys thereof. In particular embodiments, the first insulator, the second insulator and the third insulator are each formed of one or more layers of materials having a thickness in a range from approximately 1 nanometer to approximately 20 nanometers and wherein the line insulator has a thickness in a range from approximately 5 nanometers to approximately 50 nanometers.

In particular embodiments, a semiconductor memory cell array includes a plurality of memory cells, each memory cell including a first element, a second element and a channel between the first element and the second element in a body, a charge storage region juxtaposed the channel. The first element and the second element extend in a first direction through the plurality of memory cells. A element conductor is juxtaposed the first element and extends in the first direction through the plurality of memory cells continuously coupling to the first element. A line conductor is juxtaposed the charge storage region and extends in a second direction normal to the first direction and a line insulator insulates the element conductor from the line conductor.

In particular embodiments, methods of arranging semiconductor memory cells and arrays of memory cells are provided.

The foregoing and other features will be apparent from the following detailed description in conjunction with the drawings.

BRIEF DESCRIPTION OF THE DRAWINGS

FIG. 5, including

FIG. 6, including

FIG. 7 depicts a top view of a memory array based on the memory array of FIG. 4.

FIG. 8A depicts a cross-sectional view of the memory array of FIG. 7 along section line AA'.

FIG. 8B depicts a cross-sectional view of the memory array of FIG. 7 along section line BB'.

DETAILED DESCRIPTION

Figure 1:
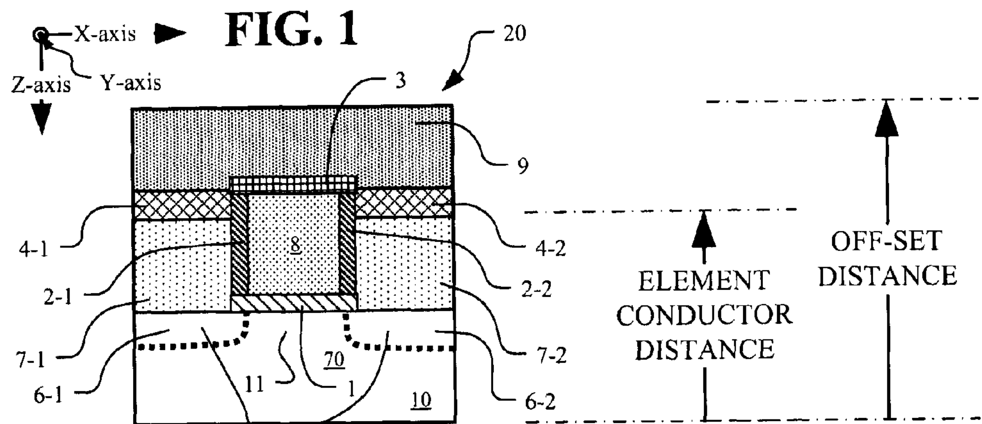
FIG. 1 depicts a cross-sectional view of a memory cell according to one embodiment of the specification.

In FIG. 1, a cross-sectional view of a memory cell 20 is shown according to one embodiment of the specification. The view in FIG. 1 is in an XZ-plane formed by the X-axis and Z-axis with the Y-axis normal to the XY-plane. The memory cell 20 includes a first element 6-1 (source), a channel 11, and a second element 6-2 (drain) in body 70 of semiconductor substrate 10. The first element 6-1 (source) and the second element 6-2 (drain) are shown in cross section in the XZ-plane of the drawing and extend in a first direction (Y-axis direction) normal to the XZ-plane. Substrate 10 is typically a silicon substrate or a silicon-on-insulator substrate. The body 70 comprises a semiconductor material of a first conductivity type (for example, p-type) having a doping level in the range from about $1\times10^{15}$ atoms/cm$^3$ to about $1\times10^{18}$ atoms/cm$^3$. The first element 6-1 (source) and the second element 6-2 (drain) are arranged in the body 70, with the channel 11 of the body 70 defined there between, and are typically heavily doped by impurity of a second conductivity type (for example, n-type) having a doping level in the range of about $1\times10^{18}$ atoms/cm$^3$ to about $5\times10^{21}$ atoms/cm$^3$. These doping regions may be arranged, for example, by thermal diffusion or by ion implantation.

The first insulator 1 is juxtaposed the channel 11 and is somewhat longer than the channel 11 so as to project over end portions of the first element 6-1 (source) and the second element 6-2 (drain). In FIG. 1, a charge storage region 8 is encapsulated by insulators including the first insulator 1, a second insulator 2 including second insulators 2-1 and 2-2, and a third insulator 3.

In this specification, the elements 6, including the first element 6-1 (source) and the second element 6-2 (drain), are interchangeable and hence any reference to a "source" can be interchanged with reference to a "drain" and vice versa. Because of this inter-changeability, an element 6 and bit line $\mathbf{6}_L$, including a region that is a first element 6-1 (source) or a second region 6-2 (drain), is referred to as a source/drain region, a drain/source region, source/drain elements, a source/drain element, a first element, a second element or a bit line as is appropriate in the context.

In this specification, typical dimensions and other parameters of the memory cell 20 are given by way of example, are not intended to be limiting and, as will be appreciated by those skilled in the art, are readily extended to other values suitable for different technology nodes.

When the process technology node for memory cell 20 is changed from a larger number to 45 nanometers or below, the channel length of channel 11, the distance between the first element 6-1 (source) and the second element 6-2 (drain), of the memory cell 20 is reduced at the same time. In the exemplary embodiment of FIG. 1, the memory cell 20 is targeted at channel lengths of 45 nanometers and below. The principles, however, apply to cells having any channel length for any node technology.

In memory cell 20 of FIG. 1, element conductors 7, including a first element conductor 7-1 and a second element conductor 7-2, are juxtaposed the first element 6-1 (source) and the second element 6-2 (drain), respectively. The element conductors 7 are bit line conductors and they are juxtaposed and extend in the same direction as bit lines $\mathbf{6}_L$ in a memory array (not shown in FIG. 1, see FIG. 7). The bit lines $\mathbf{6}_L$ of such an array are diffusions into the substrate 10 that form the first element 6-1 (source) and the second element 6-2 (drain) in a memory cell 20 and which extend from cell to cell in an array of cells formed using memory cells like memory cell 20 of FIG. 1 (see the array 80 of FIG. 7).

The element conductors 7 are good conductors including poly-silicon, amorphous silicon, poly silicon germanium, amorphous silicon germanium or metals (for example, copper, tungsten or any other metal and alloys thereof). A typical thickness for the element conductors 7 is in a range from about 50 nanometers to about 100 nanometers. If the element conductors 7 are materials that are doped by impurities, for example, poly-silicon, heavy doping is used to achieve a low resistance and high conductivity.

In FIG. 1 when the memory cell 20 is an N-channel device, arsenic, phosphorous and antimony can be used to dope the element conductor 7. If the memory cell 20 is a P-channel device, boron and indium can be used to dope the element conductor 7. For example, the polysilicon is doped with arsenic to achieve a doping level in the range from about $1\times10^{20}$ atoms/cm$^3$ to about $1\times10^{21}$ atoms/cm$^3$. Sheet resistances in the range from about 30 ohms/square to about 200 ohms/square are achieved for a typical poly-silicon layer.

In FIG. 1 when the element conductors 7 are made of metals or their alloys, sheet resistances as low as about one ohm/square are achieved. The element conductors 7, in some embodiments, contact the source/drain elements 6 directly. If an element conductor 7 is made of a material such as poly-silicon that is doped with impurities such as arsenic or phosphorous, a thin dielectric (not shown) is disposed between the element conductors 7 and the source/drain elements 6. For example, a layer of five angstroms thick hardened oxide or silicon nitride is disposed to retard the dopant diffusion from the poly-silicon of the element conductors 7 to the source/drain elements 6 when shallow source/drain elements 6 are required. This thin dielectric layer is optional and not shown in FIG. 1. The source/drain elements 6 can be formed by implantation and/or the dopant diffusion from the element conductors 7. Since the source/drain elements 6 do not require high doping, shallow source/drain elements 6 are achieved. A typical doping level in the source/drain elements 6 is in a range from about $5\times10^{18}$ atoms/$cm^3$ to about $5\times10^{19}$ atoms/$cm^3$. A typical source/drain element 6 depth is in a range from about 5 nanometers to about 200 nanometers.

In FIG. 1, the memory cell 20 architecture establishes the conductivity for each source/drain element 6 substantially less than the conductivity of a juxtaposed element conductor 7. The combined conductivity of the source/drain element 6 and the element conductor 7 is substantially greater than the conductivity of the source/drain element 6 alone. Specifically, the conductivity for source/drain element 6-1 is substantially less than the conductivity of the juxtaposed element conductor 7-1 whereby the combined conductivity of the source/drain element 6-1 and the element conductor 7-1 is substantially greater than the conductivity of the source/drain element 6-1 alone. Similarly, the conductivity for source/drain element 6-2 is substantially less than the conductivity of the juxtaposed element conductor 7-2 whereby the combined conductivity of the source/drain element 6-2 and the element conductor 7-2 is substantially greater than the conductivity of the source/drain element 6-2 alone.

The charge storage region 8 in FIG. 1 is a material capable of storing a charge and is any material capable of holding electrons or holes. In one embodiment, the charge storage region 8 is a conventional poly-silicon floating gate. A typical height for a floating gate is in the range from about 40 nanometers to about 120 nanometers. In another embodiment, the charge storage region 8 is any charge trapping dielectric such as silicon nitride, hafnium oxide and so on. A typical thickness for the charge trapping dielectric is in the range of from about 5 nanometers to about 20 nanometers. In a still other embodiment, the charge storage region 8 is nanoparticles such as silicon nanocrystal and metal nanocrystal. Typical diameters for the nanoparticles are in the range from about 5 nanometers to about 10 nanometers.

In FIG. 1, insulator 1 isolates the charge storage region 8 from the substrate. Insulator 2 isolates the charge storage region 8 from the element conductors 7. Insulator 2 can also isolate the line conductor 9 from the element conductors 7 if the element conductors 7 extend beyond the charge storage region 8. Insulator 3 isolates the charge storage region 8 from the line conductor 9. Line conductor 9 is typically a word line (WL) in a memory array (see FIG. 7). Insulator 4 isolates the element conductor 7 from the line conductor 9. These four insulators can be the same material or different materials depending on the process technology. Each insulator layer can be a single layer or composite layers. For example, the insulator 2 can be a single oxide layer or a single silicon nitride layer. The insulator 2 can also be multi-layers, for example, an oxide layer and a silicon nitride layer. The thicknesses of insulator 1, insulator 2 and insulator 3 are in the range from about 3 nanometers to about 15 nanometers. The thickness of insulator 4 is in the range from about 10 nanometers to about 40 nanometers.

In FIG. 1, the maximum height of the line conductor 9, that is of the word line in a memory array (see FIG. 7), is denoted as the OFF-SET DISTANCE and is measured in the Z-axis direction from any reference location such as the bottom of the substrate 10. In comparison, the maximum height of the element conductors 7 is denoted as the ELEMENT CONDUCTOR DISTANCE and is measured in the Z-axis direction from the same reference location as the OFF-SET DISTANCE which in FIG. 1 is the bottom of the substrate 10. In general, the ELEMENT CONDUCTOR DISTANCE must be less than the OFF-SET DISTANCE since if otherwise, the line conductor 9 would be interrupted and severed by the element conductor 7 thus preventing the line conductor 9 from conducting from cell to cell in the X-axis direction.

Figure 1A:
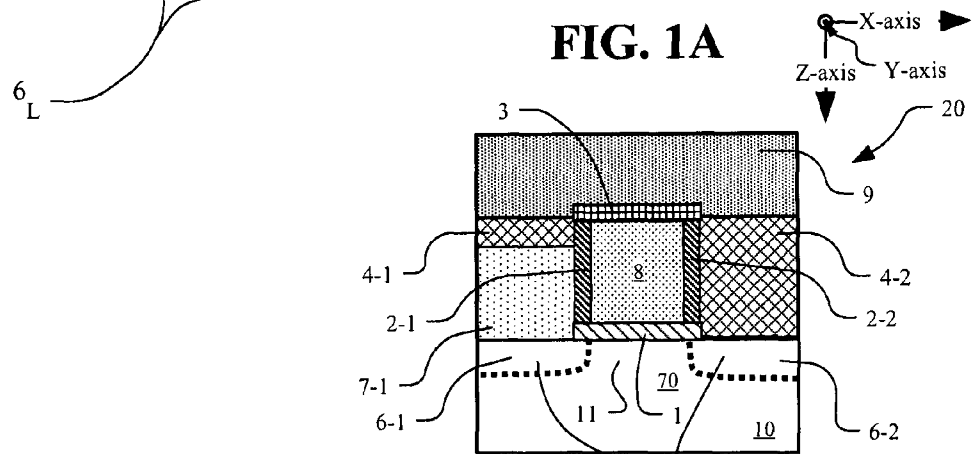
FIG. 1A depicts a cross-sectional view of a memory cell according to another embodiment of the specification.
Figure 2:
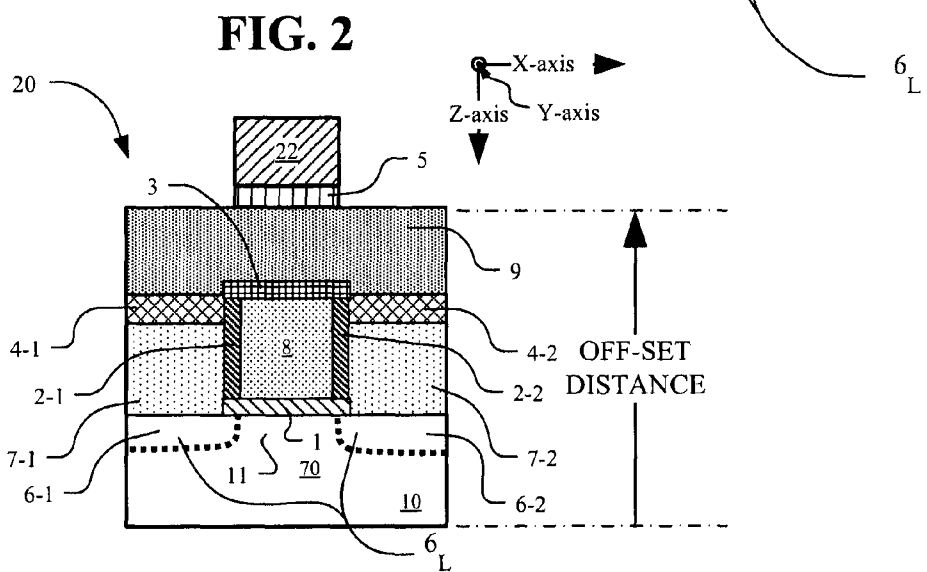
FIG. 2 depicts a cross-sectional view of a memory cell according to still another embodiment of the specification.

The element conductors 7 that are used to reduce the source/drain resistances of the bit lines $\mathbf{6}_L$ in memory cell 20 of FIG. 1 are similarly used for the same purpose in other memory cells, for example, the memory cells of FIG. 1A and FIG. 2.

FIG. 1 is a semiconductor memory cell 20 comprising a first element 6-1, a second element 6-2 and a channel 11 between the first element and the second element in a body 70. The first element 6-1 and the second element 6-2 extend in a first direction, the Y-axis direction. A charge storage region 8 is juxtaposed the channel 11. The memory cell 20 includes one or more element conductors 7-1 and 7-2. Each of the one or more element conductors 7-1 and 7-2 is juxtaposed the first element 6-1 or the second element 6-2. The one or more element conductors 7-1 and 7-2 extend in the first direction, the Y-axis direction. A line conductor 9 is juxtaposed the charge storage region 8. The line conductor 9 extends in a second direction, X-axis direction, normal to the first direction, Y-axis direction. A line insulator 4-1 and 4-2 insulates the one or more element conductors 7-1 and 7-2 from the line conductor 9.

In the semiconductor memory cell 20 of FIG. 1, the charge storage region 8 juxtaposed the channel 11 extends only to the ELEMENT CONDUCTOR DISTANCE and does not extend to an OFF-SET DISTANCE. Similarly, the one or more element conductors 7-1 and 7-2, juxtaposed the first element 6-1 or the second element 6-2 does not extend to the OFF-SET DISTANCE. The line conductor 9 juxtaposed the charge storage region 8 extends to the OFF-SET DISTANCE.

In FIG. 1A, a cross-sectional view of an alternate embodiment of a memory cell 20 is shown according to another embodiment of the specification. The memory cell 20 of FIG. 1A is substantially the same as the memory cell 20 of FIG. 1 except that in FIG. 1A only one element conductor 7, specifically element conductor 7-1 is employed. The memory cell 20 of FIG. 1A includes a first element 6-1 (source), a channel 11, and a second element 6-2 (drain) in body 70 of semiconductor substrate 10. The first insulator 1 is juxtaposed the channel 11 and is somewhat longer than the channel 11 so as to project over end portions of the first element 6-1 (source) and the second element 6-2 (drain). In FIG. 1A, a charge storage region 8 is encapsulated by insulators including the first insulator 1, a second insulator 2 formed of insulator 2-1 and optionally insulator 2-2, and a third insulator 3.

In memory cell 20 of FIG. 1A, element conductor 7 includes a first element conductor 7-1 juxtaposed the first element 6-1 (source). The element conductor 7, as described in connection with FIG. 1, is juxtaposed and extends in the same direction as bit lines $\mathbf{6}_L$ in an array (not shown in detail in FIG. 1A, see FIG. 7). The bit lines $\mathbf{6}_L$ of such an array are diffusions that form the first element 6-1 (source) and the second element 6-2 (drain) in a memory cell 20 and which extend from cell to cell in an array formed of a plurality of cells like memory cell 20 of FIG. 1A (see FIG. 7). The element conductor 7 of FIG. 1A is a good conductor, as described in connection with FIG. 1. The bit lines $6_L$ of such an array are diffusions into the substrate 10 that form the first element 6-1 (source) and the second element 6-2 (drain) in a memory cell 20 and which extend from cell to cell in an array of cells formed using memory cells like memory cell 20 of FIG. 1 (see the array 80 of FIG. 7).

The charge storage region 8 in FIG. 1A, as described in connection with FIG. 1, is a material capable of storing a charge and is any material capable of holding electrons or holes. In FIG. 1A, insulator 1 isolates the charge storage region 8 from the substrate. Insulator 2-1 isolates the charge storage region 8 from the element conductor 7-1. Insulator 2 can also isolate the line conductor 9 from the element conductor 7-1 if the element conductor 7-1 extends beyond the charge storage region 8. Insulator 3 isolates the charge storage region 8 from the line conductor 9. Line conductor 9 is typically a word line in a memory array (see FIG. 7). Insulator 4 isolates the element conductor 7 from the line conductor 9. These four insulators in FIG. 1A are the same as described in connection with FIG. 1.

In FIG. 1A, the memory cell 20 architecture is arranged with the conductivity for the bit line $6_L$ including the source/drain element 6-1 substantially less than the conductivity of a juxtaposed element conductor 7-1. The combined conductivity of the source/drain element 6-1 and the element conductor 7-1 is substantially greater than the conductivity of the bit line $6_L$ including the source/drain element 6-1.

In FIG. 2, a cross-sectional view of an alternate embodiment of a memory cell 20 is shown. The memory cell 20 of FIG. 2 is substantially the same as the memory cell 20 of FIG. 1 except that in FIG. 2, a tunneling gate 22 and insulator 5 have been added. The memory cell 20 of FIG. 2 includes a first element 6-1 (source), a channel 11, and a second element 6-2 (drain) in body 70 of semiconductor substrate 10. The first insulator 1 is juxtaposed the channel 11 and is somewhat longer than the channel 11 so as to project over end portions of the first element 6-1 (source) and the second element 6-2 (drain). In FIG. 2, a charge storage region 8 is encapsulated by insulators including a first insulator 1, a second insulator 2 formed of insulators 2-1 and 2-2, and a third insulator 3.

In memory cell 20 of FIG. 2, element conductors 7, including a first element conductor 7-1 and a second element conductor 7-2, are juxtaposed the first element 6-1 (source) and the second element 6-2 (drain), respectively. The element conductors 7 are bit line conductors since they are juxtaposed and extend in the same direction as bit lines in an array (not shown in detail in FIG. 2, see FIG. 7). The bit lines $6_L$ of such an array are diffusions that form the first element 6-1 (source) and the second element 6-2 (drain) in a memory cell 20 and which extend from cell to cell in an array of cells like memory cell 20 of FIG. 2 (see FIG. 7). The element conductors 7 of FIG. 2 are good conductors, as described in connection with FIG. 1.

The charge storage region 8 in FIG. 2, as described in connection with FIG. 1, is a material capable of storing a charge and is any material capable of holding electrons or holes. In FIG. 2, insulator 1 isolates the charge storage region 8 from the substrate. Insulator 2 isolates the charge storage region 8 from the element conductors 7. Insulator 2 can also isolate the line conductor 9 from the element conductors 7 if the element conductors 7 extend beyond (above in FIG. 2) the charge storage region 8. Insulator 3 isolates the charge storage region 8 from the line conductor 9. Line conductor 9 is typically a word line in a memory array (see line conductors 9-1, 9-2 and 9-3 in FIG. 7). Insulator 4 isolates the element conductor 7 from the line conductor 9. These four insulators in FIG. 2 are the same as described in connection with FIG. 1.

In FIG. 2, the tunneling gate 22 is typically poly-silicon material. The insulator 5 isolates the tunneling gate 22 from the line conductor 9. Insulator 5 in some embodiments is a single layer such as oxide and in other embodiments is a composite multi-layer, for example, an oxide layer and a silicon nitride layer. Other insulator materials such as Hafnium oxide, Zirconium oxide and Hafnium nitride oxide can be used for the insulator 5. In one example, the insulator 5 comprises a tunneling dielectric (TD) layer 44 and a blocking dielectric (BD) layer 43 (not shown in FIG. 2, see FIG. 8A through FIG. 8D). In one example, the tunneling dielectric 44 is an oxide layer having a thickness of about 2 nanometers and the blocking dielectric 43 is a silicon nitride layer having a thickness of about 2 nanometers.

In FIG. 2, the memory cell 20 architecture is arranged with the conductivity for each source/drain element 6 substantially less than the conductivity of a juxtaposed element conductor 7. The combined conductivity of the source/drain element 6 and the element conductor 7 is substantially greater than the conductivity of the source/drain element 6. Specifically, the conductivity for source/drain element 6-1 is substantially less than the conductivity of the juxtaposed element conductor 7-1, but the combined conductivity of the source/drain element 6-1 and the element conductor 7-1 is substantially greater than the conductivity of the source/drain element 6-1 alone. Similarly, the conductivity of source/drain element 6-2 is substantially less than the conductivity of the juxtaposed element conductor 7-2. The combined conductivity of the source/drain element 6-2 and the element conductor 7-2 is substantially greater than the conductivity of the source/drain element 6-2 alone.

Figure 3:
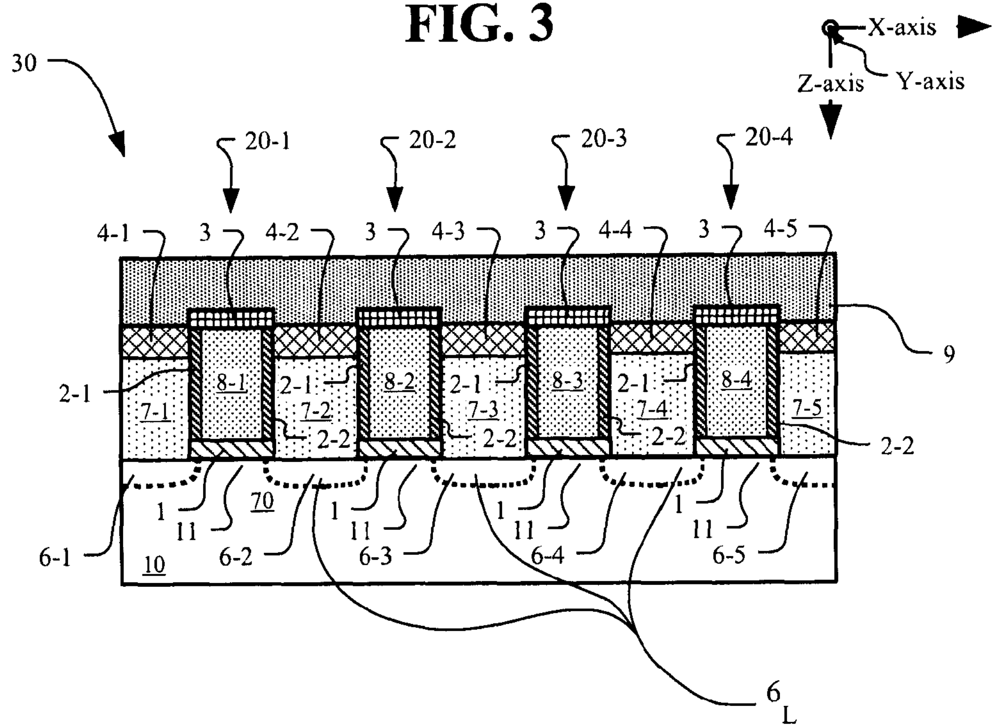
FIG. 3 depicts a memory array formed with a plurality of memory cells of the FIG. 1 type.

In FIG. 3, a memory array 30 includes a plurality of memory cells 20 of the FIG. 1 type, including memory cells 20-1, 20-2, 20-3 and 20-4. The memory cells 20 are typically arranged in rows and columns extending to construct the memory array 30. FIG. 3 depicts one row of cells 20 arrayed and spaced-apart in the X-axis direction. Additional memory cells are arrayed in a direction (Y-axis direction) normal to the plane of FIG. 3 (see FIG. 7). In memory array 30, the line conductor 9 extends in the X-axis direction and electrically couples to each of the memory cells 20-1, 20-2, 20-3 and 20-4. In array 30, the cells 20-1, 20-2, 20-3 and 20-4 have sources and drains formed by the bit line source/drain elements 6, including source/drain elements 6-1, 6-2, 6-3, 6-4 and 6-5. The source/drain elements 6 are normal to the plane of the FIG. 3 drawing and are arrayed perpendicular to the line conductor 9 (extending in the X-axis direction). Each source/drain element 6 typically is formed by diffusion into the substrate 10. The source/drain elements 6, including source/drain elements 6-1, 6-2, 6-3, 6-4 and 6-5, are juxtaposed element conductors 7, including element conductors 7-1, 7-2, 7-3, 7-4 and 7-5, respectively. The array 30 of FIG. 3 can include any number of cells 20, for example, 4, 8, 16, 32 or more cells extending in the direction normal to the plane of the FIG. 3 drawing so that the length of the diffusions for the source/drain elements 6 can be one or more millimeters in length. The source/drain diffusions for the source/drain elements 6 in FIG. 3 are formed in the same way as the diffusions described for the source/drain elements 6 in FIG. 1. The diffusions for the source/drain elements 6 connect the source/drain elements 6 for each cell in a direction normal to the plane of the drawing of FIG. 3.

In FIG. 3, a memory array 30 includes charge storage regions 8 juxtaposed the channels 11 and specifically includes charge storage regions 8-1, 8-2, 8-3 and 8-4. Each charge storage region 8 is encapsulated by insulators including the first insulator 1, a second insulator 2 formed of insulators 2-1 and 2-2, and a third insulator 3.

In FIG. 3, the element conductors 7, including element conductors 7-1, 7-2, 7-3, 7-4 and 7-5 are juxtaposed insulators 4, including insulators 4-1, 4-2, 4-3, 4-4 and 4-5, respectively. The insulators 4 isolate the element conductors 7 from the line conductor 9.

In FIG. 3, the array 30 architecture is arranged with the conductivity for each source/drain element 6 substantially less than the conductivity of a juxtaposed element conductor 7. The combined conductivity of the source/drain element 6 and the element conductor 7, however, is substantially greater than the conductivity of the source/drain element 6 alone.

Figure 4:
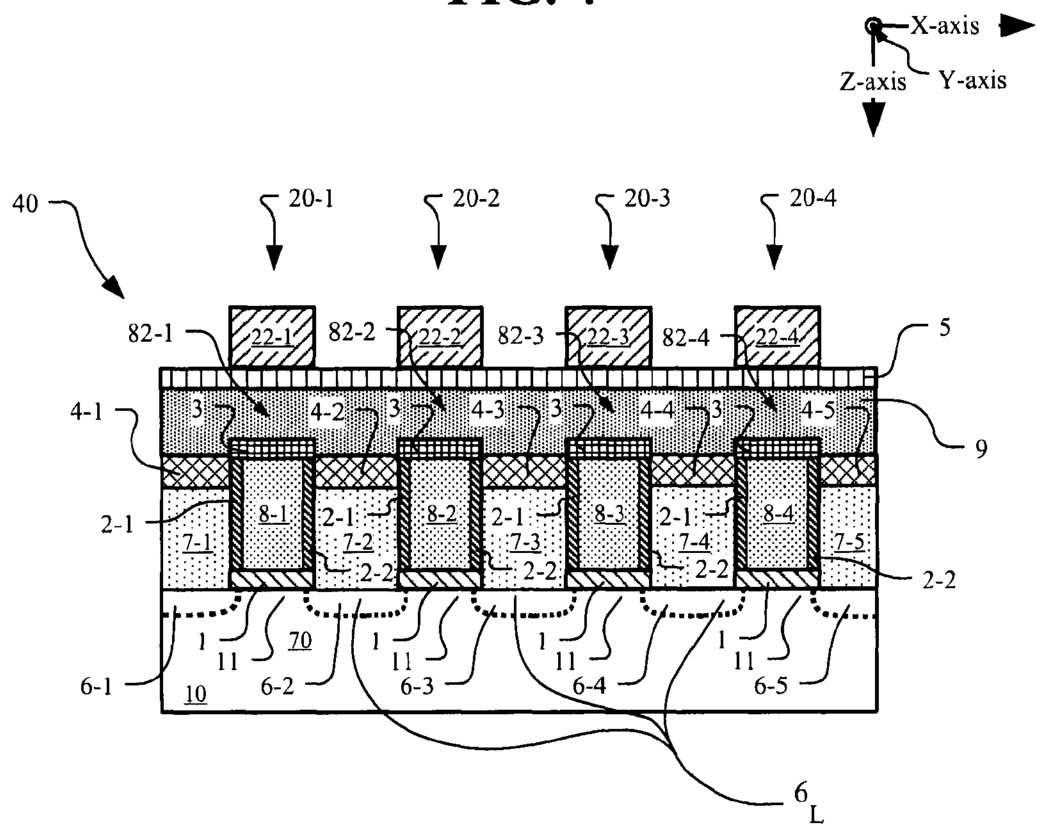
FIG. 4 depicts a memory array formed with a plurality of memory cells of the FIG. 2 type.

In FIG. 4, a memory array 40 includes a plurality of memory cells 20 of the FIG. 2 type, including cells 20-1, 20-2, 20-3 and 20-4. FIG. 4 depicts one row of cells 20 arrayed and spaced-apart in the X-axis direction. Additional memory cells are arrayed in a direction (Y-axis direction) normal to the plane of FIG. 4 (see FIG. 7). In the memory array 40, the line conductor 9 electrically couples each memory cell 20 and extends in the X-axis direction. The bit lines $\mathbf{6}_L$ include source/drain elements 6-1, 6-2, 6-3, 6-4 and 6-5 that are juxtaposed element conductors 7, including element conductors 7-1, 7-2, 7-3, 7-4 and 7-5, respectively. Each bit line is formed as a bit line diffusion that extends in the Y-axis direction normal to the line conductor 9 that extends in the X-axis direction. The bit lines $\mathbf{6}_L$ including source/drain elements 6-1, 6-2, 6-3, 6-4 and 6-5 can be a number of millimeters long. The bit line diffusions $\mathbf{6}_L$ including source/drain elements 6-1, 6-2, 6-3, 6-4 and 6-5 are formed in the same way as the source/drain elements 6 in FIG. 1.

The bit lines $\mathbf{6}_L$ including source/drain elements 6-1, 6-2, 6-3, 6-4 and 6-5 of each memory cell 20 extend in the Y-axis direction. For example, each memory cell 20 of the memory cells 20-1, 20-2, 20-3 and 20-4 has one bit line diffusion as its source and has another bit line diffusion as its drain where the source and drain are interchangeable. A plurality of tunneling lines 22 (TL) including tunneling lines 22-1, 22-2, 22-3 and 22-4 are provided in the array 40. Each of the tunneling lines 22 extends in the Y-axis direction; that is, extends in the same direction as the bit lines $\mathbf{6}_L$. The tunneling lines 22-1, 22-2, 22-3 and 22-4 extend in the Y-axis direction and electrically couple the tunneling gates 82-1, 82-2, 82-3 and 82-4, respectively, of the memory cells 20-1, 20-2, 20-3 and 20-4.

In this specification, the manufacturing methods of the memory cells 20 in FIG. 1 through FIG. 4 and the array 30 of FIG. 3 and the array 40 of FIG. 4 are described in connection with FIG. 5 through FIG. 8. The manufacturing steps are as follows.

Figure 5A:
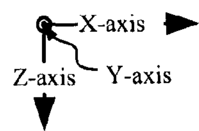
FIG. 5A, FIG. 5B, FIG. 5C, FIG. 5D, FIG. 5E, FIG. 5F, FIG. 5G, FIG. 5H, FIG. 5I, FIG. 5J, FIG. 5K, FIG. 5L and FIG. 5M, depict manufacturing steps for the manufacture of the memory cells in FIG. 1, FIG. 1A and FIG. 2 and the arrays in FIG. 3 and FIG. 4.
Figure 5A:
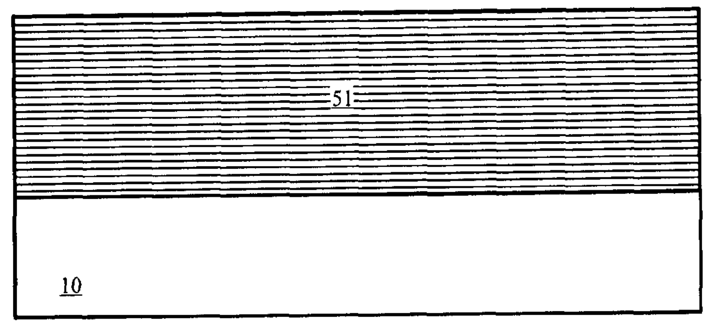

Referring to FIG. 5A, a cross section of the initially formed structure is shown. In FIG. 5A, a layer 51 is formed on a substrate 10. The layer 51 is typically an oxide formed by a conventional LPCVD technique. The substrate 10 is a silicon substrate or other type of substrate such as a Silicon-on-insulator ("SOI") substrate. The thickness of the layer 51 is adjusted according to the process technology employed. A typical thickness of layer 51 is about 100 nanometers. The layer 51 alternatively can be thermally grown as an oxide from substrate 10 using a conventional furnace. The layer 51 alternatively can be material other than oxide provided that etching of the layer 51 stops on the substrate 10. For example, oxynitride can be used for the layer 51.

Figure 5B:
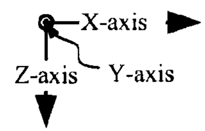
Figure 5B:
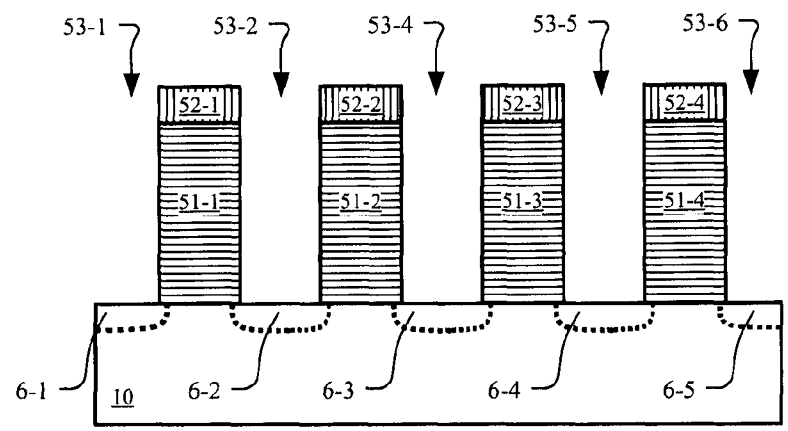

Referring to FIG. 5A and FIG. 5B, the oxide layer 51 of FIG. 5A is patterned with a photo mask 52-1, 52-2, 52-3 and 52-4. A hard mask can be disposed between the photo-resist and the oxide layer. For example, silicon nitride or oxynitride can be used as the hard mask. The hard mask is optional and is not shown.

The oxide layer 51 is etched to form the oxide strips 51-1, 51-2, 51-3 and 51-4 bounded and separated by the openings 53-1, 53-2, 53-3, 53-4, 53-5 and 53-6. The etch stops at the substrate 10. However, a little over-etch into the substrate 10 can occur and can be tolerated. The width and the spacing of the oxide strips 51-1, 51-2, 51-3 and 51-4 can be the minimum feature size allowed for the process technology being employed. For example, the widths of the oxide strips 51-1, 51-2, 51-3 and 51-4 are 45 nanometers for 45 nanometer technology nodes.

The width and the spacing of the oxide strips 51-1, 51-2, 51-3 and 51-4 can be adjusted to be larger or smaller than the minimum feature size. For example, the width of the photo-resist strips can be trimmed to be smaller than 45 nanometers, so the width of the oxide strips is smaller than 45 nanometers.

In FIG. 5B, optionally, impurities are implanted into the substrate 10 through the openings 53-1, 53-2, 53-3, 53-4, 53-5 and 53-6 to form the bit line diffusions including the source/drain elements 6-1, 6-2, 6-3, 6-4 and 6-5. For example, Arsenic is implanted into the substrate 10 to form the bit line diffusion for N-channel memory cells 20. Boron is implanted to form the bit line diffusion for P-channel memory cell 20. Co-implanting can be done to retard the diffusion of the impurities inside the substrate during the thermal steps. For example, germanium can be implanted with Arsenic together to reduce the Arsenic diffusion. This implant step is optional.

FIG. 5B depicts a cross section of the resulting structure after the processing as described.

The photo-resist photo mask 52-1, 52-2, 52-3 and 52-4 is removed and the wafer is cleaned. The dirty materials besides the oxide residual are removed from the portion of the surface of the substrate region that is not covered by the oxide strips 51-1, 51-2, 51-3 and 51-4. The oxide strips 51-1, 51-2, 51-3 and 51-4 remain after the cleaning.

Figure 5C:
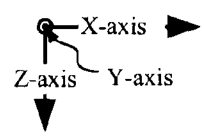
Figure 5C:
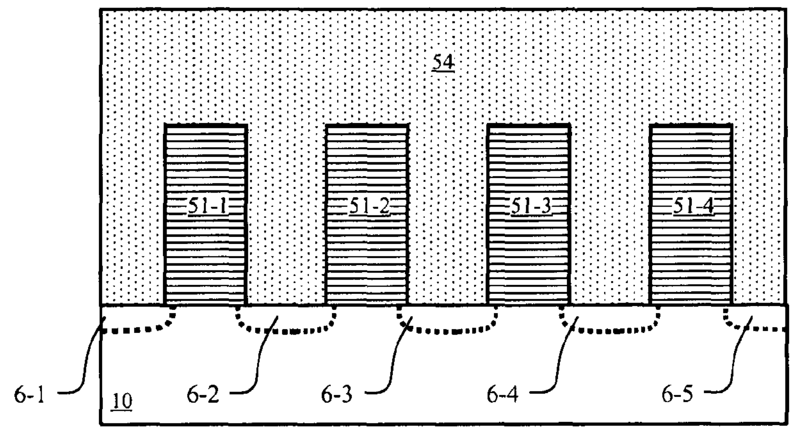

Referring to FIG. 5C, a layer 54 is deposited, and in one embodiment, layer 54 is poly-silicon. Preferable, the poly-silicon layer 54 is deposited with a top surface as flat as possible, but the top surface is not required to be flat. The layer 54 can also be amorphous silicon, poly silicon germanium, amorphous silicon germanium or any other conductor. The layer 54 can be in-situ doped or implanted with impurities. For example, Arsenic is implanted into layer 54 to form N+ poly silicon. Boron is implanted into layer 54 to form P+ poly silicon.

The dopant from the poly-silicon layer 54 can diffuse into the substrate 10 to dope or form the bit line $\mathbf{6}_L$ diffusions including source/drain elements 6-1, 6-2, 6-3, 6-4 and 6-5. If this dopant diffusion needs to be retarded, a thin layer of dielectric can be disposed between the substrate 10 and the poly-silicon layer 54. For example, a five angstroms hardened oxide or silicon nitride layer can serve as the thin layer of dielectric.

FIG. 5C depicts a cross section of the resulting structure after the processing as described.

Figure 5D:
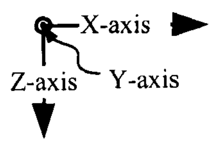
Figure 5D:
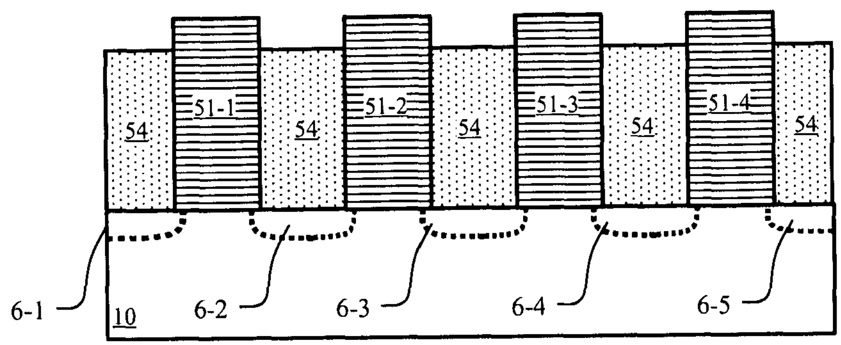

Referring to FIG. 5C and FIG. 5D, the poly-silicon layer 54 is CMP polished and then etched back. Alternatively, the poly-silicon layer 54 is etched back directly to form the poly-silicon strips 54 between and around the oxide strips 51-1, 51-2, 51-3 and 51-4. The polysilicon strips 54 are recessed relative to the oxide strips 51-1, 51-2, 51-3 and 51-4.

A typical thickness of the poly-silicon strips 54 is in the range from about 50 nanometers to about 100 nanometers and can be thicker if the oxide strips 51-1, 51-2, 51-3 and 51-4 are thicker.

FIG. 5D depicts a cross section of the resulting structure after the processing as described.

Figure 5E:
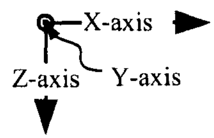
Figure 5E:
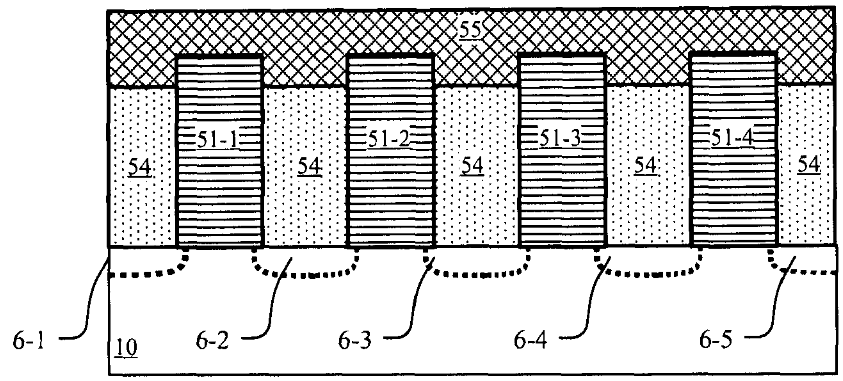

Referring to FIG. 5E, a layer 55 of silicon nitride is formed using conventional LPCVD techniques. The preferred thickness of layer 55 extends above the oxide strips 51-1, 51-2, 51-3 and 51-4 so that the top surface of layer 55 is as flat as possible, although the top surface is not required to be flat. A typical thickness of layer 55 is in the range from about 40 nanometers to about 100 nanometers.

FIG. 5E depicts a cross section of the resulting structure after the processing as described.

Figure 5F:
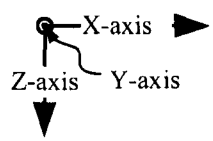
Figure 5F:
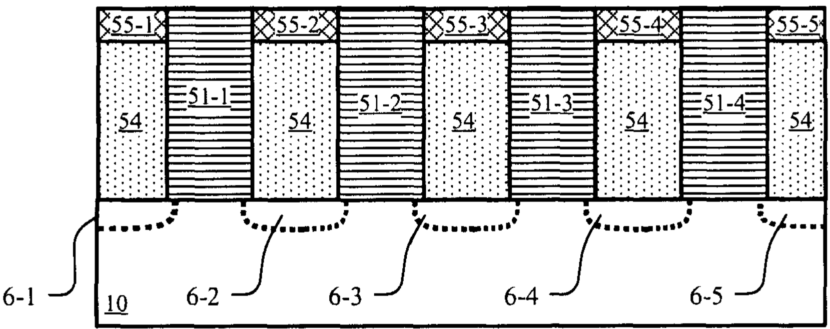

Referring to FIG. 5F, the silicon nitride layer is CMP polished or etched back to form the silicon nitride strips 55-1, 55-2, 55-3 and 55-4. A typical thickness of the silicon nitride the silicon nitride strips 55-1, 55-2, 55-3 and 55-4 is in the range from about 10 nanometers to about 40 nanometers.

FIG. 5F depicts a cross section of the resulting structure after the processing as described.

Figure 5G:
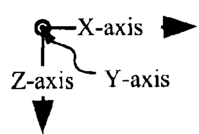
Figure 5G:
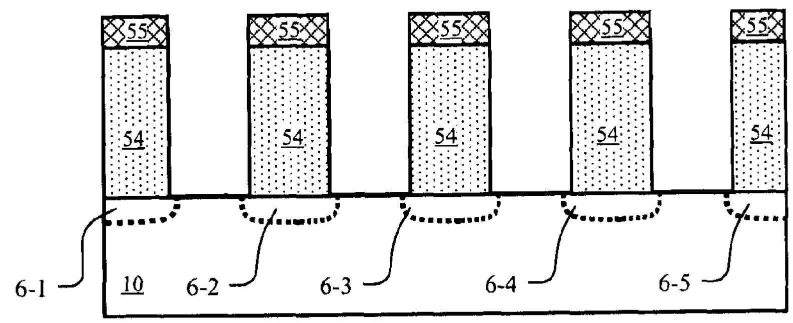

Referring to FIG. 5G, the oxide strips 51-1, 51-2, 51-3 and 51-4 are etched away using a conventional etching method. For example, wet etching such as HF dip or dry etching are used.

FIG. 5G depicts a cross section of the resulting structure after the processing as described.

Figure 5H:
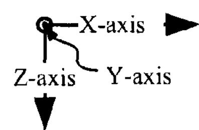
Figure 5H:
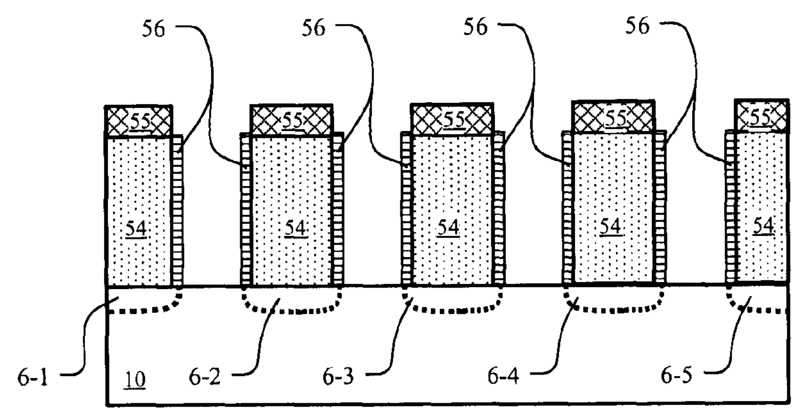

Referring to FIG. 5H, an oxide layer 56 is grown on the sidewalls of the polysilicon strips 54 using a conventional furnace. A typical thickness for this oxide layer 56 is in the range from about 2 nanometers to about 10 nanometers. This oxide layer 56 is optional, however.

FIG. 5H depicts a cross section of the resulting structure after the processing as described.

Figure 5I:
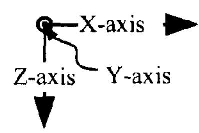
Figure 5I:
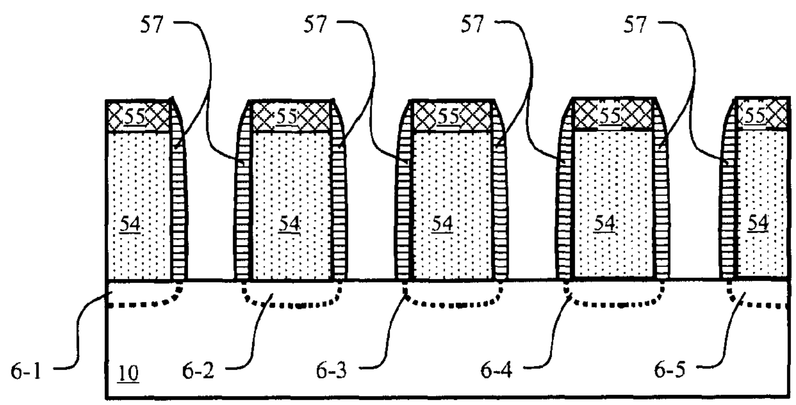

Referring to FIG. 5I, an insulating layer 57, such as an oxide layer or a silicon nitride layer, is formed for example using conventional LPCVD techniques. Deposition techniques are preferable for the oxide layer 57 formation to reduce thermal budget. The layer 57 can be optionally etched to form a spacer 57 to cover the sidewall of the poly-silicon strips 54 (as shown in FIG. 5I). A typical width of the sidewall spacer 57 is in the range from about 3 nanometers to about 15 nanometers.

FIG. 5I depicts a cross section of the resulting structure after the processing as described.

Figure 5J:
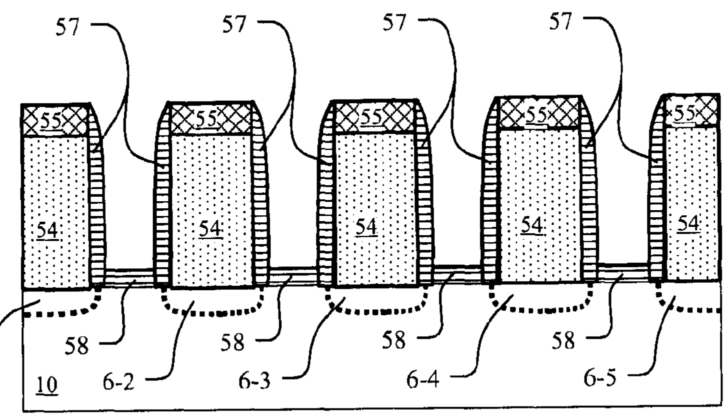

Referring to FIG. 5J, the wafer is cleaned and an oxide layer 58 is grown using a conventional thermal furnace. Alternatively, the oxide layer 58 can be deposited using conventional LPCVD techniques. The layer 58 alternatively can be formed from other materials as long as such materials prevent the electrons/holes stored in a charge storage regions to be formed from leaking to the substrate. For example, the layer 58 can be a high-quality jet vapor deposited silicon nitride or a silicon nitride grown by rapid thermal nitridation processes. The layer 58 can be a single layer or composite layer. For example, the layer 58 can be multi-layers formed with oxide and silicon nitride. A typical thickness for the oxide layer 58 is in the range from about 3 nanometers to about 15 nanometers.

FIG. 5J depicts a cross section of the resulting structure after the processing as described.

Figure 5K:
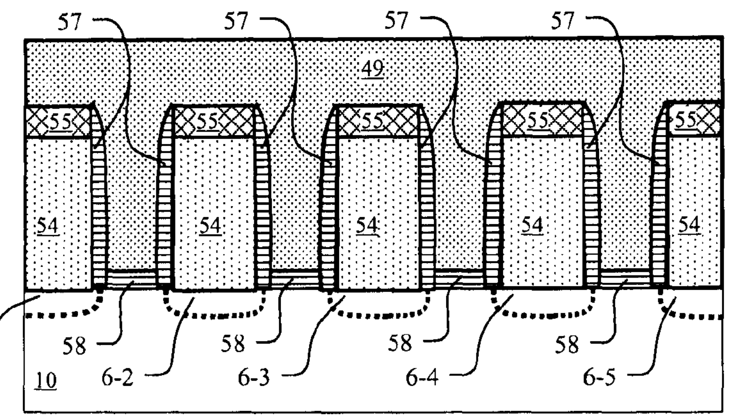

Referring to FIG. 5K, a second poly-silicon layer 49 is deposited using conventional LPCVD techniques. The poly-silicon layer 49 is deposited with a preferred thickness allowing the top surface to be as flat as possible, although the top surface is not required to be flat.

Alternatively, the layer 49 can be amorphous silicon, poly silicon germanium and amorphous silicon germanium. Additionally, the layer 49 can be any charge trapping dielectric such as silicon nitride, hafnium oxide and so on. Also, the layer 49 can be nano-particles. The layer 49 can be in-situ doped or implanted with impurities. For example, Arsenic is implanted into layer 49 to form N+ poly silicon. Boron is implanted into layer 49 to form P+ poly silicon. A typical doping level is in the range from about $1\times10^{19}$ atoms/$cm^3$ to about $5\times10^{20}$ atoms/$cm^3$.

FIG. 5K depicts a cross section of the resulting structure after the processing as described.

Figure 5L:
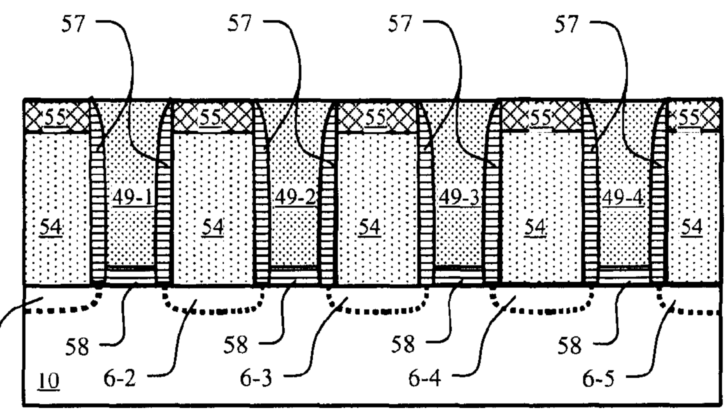

Referring to FIG. 5L, the second poly-silicon layer 49 in FIG. 5K is CMP polished and/or etched back to form the isolated poly-silicon strips 49-1, 49-2, 49-3 and 49-4. These polysilicon strips are used to define the floating gate poly later. The poly-silicon strips 49-1, 49-2, 49-3 and 49-4 can be recessed relative to the top surface of the silicon nitride strips 55. A typical thickness of the poly-silicon strips 49-1, 49-2, 49-3 and 49-4 is in the range from about 40 nanometers to about 120 nanometers.

FIG. 5L depicts a cross section of the resulting structure after the processing as described.

Figure 5M:
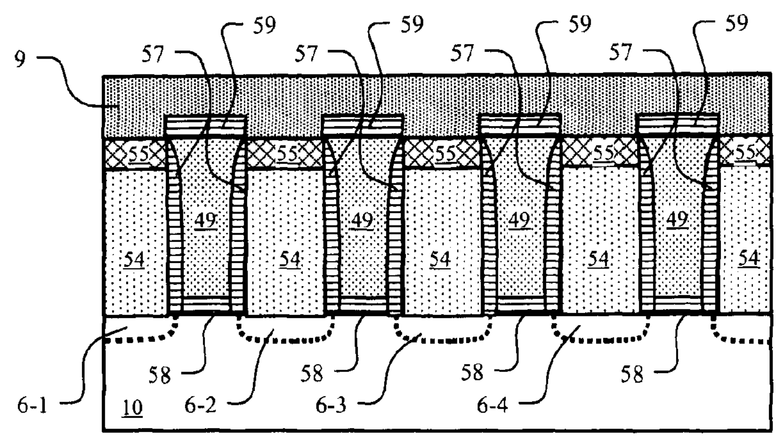

Referring to FIG. 5M, a thin layer of oxide 59 is formed on the top of the polysilicon strips 49. The oxide layer 59 can be thermally grown or deposited. The oxide layer 59 isolates the floating gates 8 formed of the poly-silicon strips 49 from the line conductor 9. The layer 59 can be other materials as long as they prevent the electrons/holes stored in the charge storage region 49 of floating gates 8 from leaking.

A third poly-silicon layer 9 is deposited using conventional LPCVD techniques. A typical thickness of this poly-silicon layer 9 is in the range from about 30 nanometers to about 100 nanometers. The poly-silicon layer 9 can also be other conductive materials such as WSix. The poly-silicon layer 9 can be in-situ doped or implanted with impurities. Either P+ type or N+ type poly-silicon can be used for the poly-silicon layer 9. A high doping level from about $1\times10^{20}$ atoms/$cm^3$ or higher is preferred to make the poly-silicon layer 9 conductive.

FIG. 5M depicts a cross section of the resulting structure after the processing as described.

Referring to FIG. 5M, the third layer of poly-silicon 9 is patterned with a photo mask and etched to form the line conductor 9. Thereafter, the process flow follows a standard process for making memories.

Figure 6A:
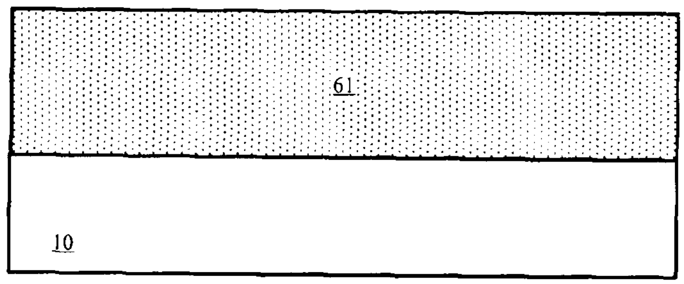
FIG. 6A, FIG. 6B, FIG. 6C and FIG. 6D, depict alternate manufacturing steps for the manufacture of the memory cell in FIG. 1, FIG. 1A and FIG. 2 and the arrays in FIG. 3 and FIG. 4.

FIG. 6A shows a modified process flow to manufacture the memory arrays.

After the substrate 10 is cleaned, a poly-silicon layer 61 is formed using conventional LPCVD techniques. The layer 61 is used as the element conductor 7 (see FIG. 1 through FIG. 4). The thickness and the doping level of poly-silicon layer 61 is the same as previously described in connection with poly-silicon layer 54 in connection with FIG. 5.

FIG. 6A depicts a cross section of the resulting structure after the processing as described.

Figure 6B:
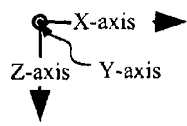
Figure 6B:
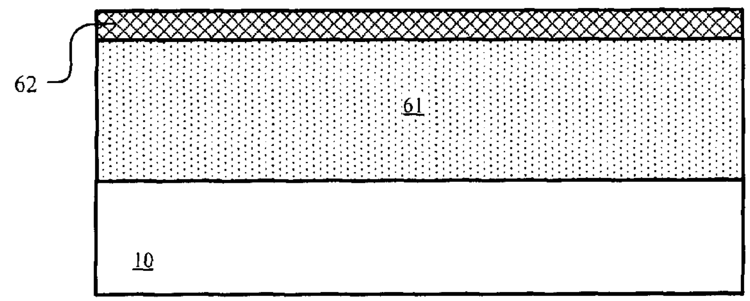

Referring to FIG. 6B, a silicon nitride layer 62 is formed on poly-silicon layer 61 using conventional LPCVD techniques. The thickness of the silicon nitride layer 62 is the same as the silicon nitride layer 55 in FIG. 5G.

FIG. 6B depicts a cross section of the resulting structure after the processing as described.

Figure 6C:
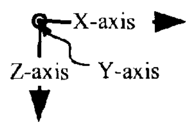
Figure 6C:
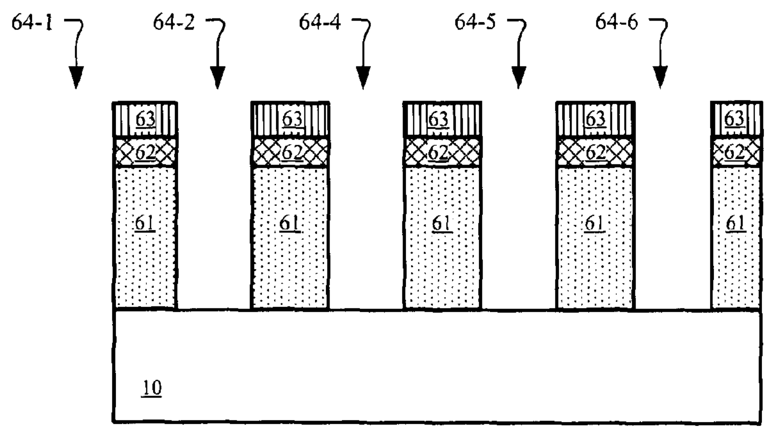

Referring to FIG. 6C, the silicon nitride 62 and poly-silicon 61 stack is patterned with a photo mask 63. A hard mask can be disposed between the photo-resist and the stack. For example, oxide or oxynitride can be used as the hard mask. The hard mask is optional and not shown in FIG. 6C.

Figure 6D:
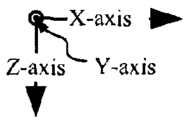
Figure 6D:
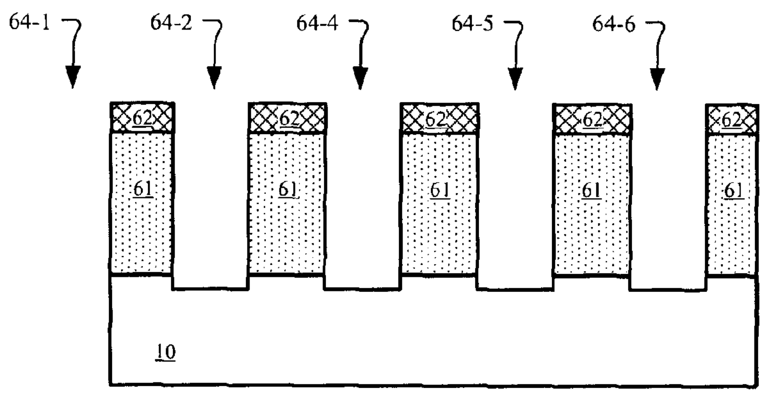

In FIG. 6C, the stack is etched to form the silicon nitride 62 and poly-silicon 61 stack. The etch stops on the substrate 10, a little over-etch into the substrate 10 can be done (the over etch is shown in FIG. 6D).

The width and the spacing of the silicon nitride 62 and poly-silicon 61 stack can be minimum feature size, as allowed by the process technology. For example, the width is 45 nanometers for a 45 nanometers technology node.

In FIG. 6C, the width and the spacing can be adjusted to be larger or smaller than the minimum feature size. For example, the width of the photo-resist strips 63 can be trimmed to be smaller than 45 nanometers, so the width of the silicon nitride/poly-silicon 61 strips is smaller than 45 nanometers.

FIG. 6C depicts a cross section of the resulting structure after the processing as described.

In FIG. 6D, an over-etch is shown extending with groves into the substrate 10. A typical depth of the groves can be in the range from about 5 nanometers to about 50 nanometers.

FIG. 6D depicts a cross section of the resulting structure after the processing as described.

Commencing either with the structure of FIG. 6C or FIG. 6D, the process flow typically follows as described from FIG. 5H to FIG. 5M to form the memory array 30 in FIG. 3.

In summary, FIG. 5 and FIG. 6 represent the process flow to manufacture the memory array 30 shown in FIG. 3. From the memory array 30 in FIG. 3, an insulator (the insulator 5 in FIG. 4) is formed on the top of the line conductor 9. Then another layer of poly-silicon is deposited. After the layer of poly-silicon is patterned with a photo mask and etched to form strips, the memory array in FIG. 4 is obtained. A top view of a memory array 80, based on the memory array 40 in FIG. 4, is shown in FIG. 7. A top view of a memory array, based on the memory array 30 in FIG. 3, is substantially identical to the memory array 80 of FIG. 7 absent, however, the tunneling lines 22.

In FIG. 7, memory array 80 includes a plurality of memory cells 20 of the FIG. 2 type, including cells 20-1, 20-2 and 20-3; 20-1', 20-2' and 20-3'; and 20-1", 20-2" and 20-3". The memory cells 20 are arranged in rows (X-axis direction) and columns (Y-axis direction) to construct the memory array 80. In the memory array 80, the line conductors 9, including line conductors 9-1, 9-2 and 9-3, extend in a row direction, X-axis direction. The bit lines $\mathbf{6}_L$ including source/drain elements 6-1, 6-2, 6-3 and 6-4 are juxtaposed element conductors 7, including element conductors 7-1, 7-2, 7-3 and 7-4, respectively. Each bit line $\mathbf{6}_L$ is formed as a bit line diffusion that extends in the Y-axis direction normal to the line conductor 9 that extends in the X-axis direction. The bit lines $\mathbf{6}_L$ including source/drain elements 6-1, 6-2, 6-3 and 6-4 can be a number of millimeters long. The bit lines $\mathbf{6}_L$ including source/drain elements 6-1, 6-2, 6-3 and 6-4 are typically formed as diffusions in the same way as described in connection with the source/drain elements 6 in FIG. 1.

The bit lines including source/drain elements 6-1, 6-2, 6-3 and 6-4 of the memory cells 20 extend in the Y-axis direction. For example, the memory cells 20 including memory cells 20-1, 20-2 and 20-3; 20-1', 20-2' and 20-3'; and 20-1", 20-2" and 20-3" has one bit line $\mathbf{6}_L$ diffusion as its source and has another bit line $\mathbf{6}_L$ diffusion as its drain where the source and drain are interchangeable. A plurality of tunneling lines 22 including tunneling lines 22-1, 22-2 and 22-3 are provided in the array 80. Each of the tunneling lines 22 extends in the Y-axis direction; that is, extends in the same direction as the bit lines $\mathbf{6}_L$. Each tunnel line 22 electrically couples the tunneling gates of memory cells 20 arranged in the tunneling line orientation, that is, the Y-axis direction.

For the memory array 80 of FIG. 7, the charge storage regions 8, including the charge storage regions 8-1, 8-2 and 8-3; 8-1', 8-2' and 8-3'; and 8-1", 8-2" and 8-3" are polysilicon floating gates (FG). During the manufacturing process, implants can be done after the isolated floating gate is formed. For example, if the bit line $\mathbf{6}_L$ diffusion is N-type, Boron is implanted into the substrate to isolate the bit line diffusion wells. A typical doping level of this Boron implant can be in the range from about $1\times10^{17}$ atoms/cm$^3$ to about $2\times10^{19}$ atoms/cm$^3$.

The memory array 80 of FIG. 7 includes a plurality of memory cells 20 extending in a first direction, X-axis direction and in a second direction, Y-axis direction. Each memory cell includes a first element (such as 6-1), a second element (such as 6-2) and a channel 11 (see FIG. 4) between the first element and the second element in a body 70 (see FIG. 4). Each memory cell 20, including memory cells 20-1, 20-2 and 20-3; 20-1', 20-2' and 20-3'; and 20-1", 20-2" and 20-3", a charge storage region 8, including the charge storage regions 8-1, 8-2 and 8-3; 8-1', 8-2' and 8-3'; and 8-1", 8-2" and 8-3", juxtaposed the channel 11. A first element conductor (such as 7-1) and a second element conductor (such as 7-2) is in contact with the first element (such as 6-1) and the second element (such as 6-2), respectively. A line conductor 9 (such as line conductors 9-1, 9-2 and 9-3) is juxtaposed the charge storage region 8 (such as charge storage regions 8-1, 8-2 and 8-3; 8-1', 8-2' and 8-3'; and 8-1", 8-2" and 8-3"). Line insulators 4 (see line insulators 4-1, 4-2, 4-3, 4-4 and 4-5 in FIG. 4) insulate the element conductors (such as 7-1 and 7-2) from the line conductors (such as line conductors 9-1, 9-2 and 9-3). The line conductors extend to a first plurality of the memory cells where line conductor 9-1 extends to memory cells 20-1, 20-2 and 20-3; where line conductor 9-2 extends to memory cells 20-1', 20-2' and 20-3'; and where line conductor 9-3 extends to memory cells 20-1", 20-2" and 20-3". The line conductors (such as line conductors 9-1, 9-2 and 9-3) extend in the first X-axis direction so as to be juxtaposed the charge storage regions (such as charge storage regions 8-1, 8-2 and 8-3; 8-1', 8-2' and 8-3'; and 8-1", 8-2" and 8-3") in each of the plurality of memory cells 20. The first element (such as 6-1) and the second element (such as 6-2) and the first element conductor (such as 7-1) and the second element conductor (such as 7-2) from one memory cell (such as memory cell 20-1") extend to another memory cell (such as 20-1' and 20-1) whereby the first element (such as 6-1) and the first element conductor (such as 7-1) and the second element (such as 6-2) and the second element conductor (such as 7-2), respectively, are in contact in the plurality of memory cells (such as 20-1", 20-1' and 20-1).

FIG. 8A depicts a cross-sectional view of the memory array of FIG. 7 along section line AA'. The insulator 5 is optionally provided and functions as a gate insulator that typically includes multiple layers 43 and 44. The insulator 5 is optionally provided. When insulator 5 includes multiple layers 43 and 44, in one embodiment, each layer comprises material selected from the group consisting of oxide, nitride, oxynitride, Al2O3, HfO2, TiO2, ZrO2, Ta2O5, combinations thereof and alloys thereof. In another embodiment, a first layer 43 is formed of oxide and a second layer 44 is formed of material selected from the group consisting of nitride, oxynitride, Al2O3, HfO2, TiO2, ZrO2, Ta2O5, combinations thereof and alloys thereof. In a further embodiment, a first layer 43 is formed of oxynitride and a second layer 44 is formed of material selected from the group consisting of nitride, Al2O3, HfO2, TiO2, ZrO2, Ta2O5, combinations thereof and alloys thereof.

FIG. 8B depicts a cross-sectional view of the memory array of FIG. 7 along section line BB'. The insulator 5 is an optional gate insulator that typically includes multiple layers 43 and 44 as described in connection with FIG. 8A.

Figure 8C:
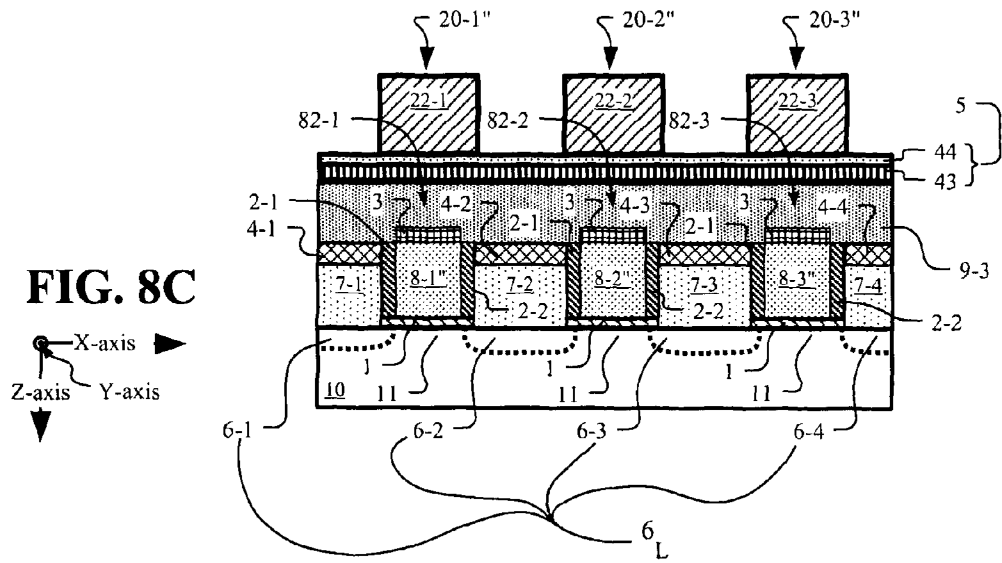
FIG. 8C depicts a cross-sectional view of the memory array of FIG. 7 along section line CC'.

FIG. 8C depicts a cross-sectional view of the memory array of FIG. 7 along section line CC'. In FIG. 8C, a plurality of memory cells 20, including cells 20-1", 20-2" and 20-3", are arranged in a row (X-axis direction). The line conductor 9-3 of extends to each of the memory cells 20, including cells 20-1", 20-2" and 20-3", and extends in the row direction, X-axis direction. The bit lines $6_L$ include source/drain elements 6-1, 6-2, 6-3 and 6-4 that are juxtaposed element conductors 7, including element conductors 7-1, 7-2, 7-3 and 7-4, respectively. Each bit line $6_L$ is formed as a bit line diffusion that extends in the Y-axis direction normal to the line conductor 9 that extends in the X-axis direction.

The bit lines $6_L$ including source/drain elements 6-1, 6-2, 6-3 and 6-4 of each memory cell 20 extend in the Y-axis direction. Each memory cell 20 of the memory cells 20-1", 20-2" and 20-3" has one bit line $6_L$ diffusion as its source and has another bit line $6_L$ diffusion as its drain where the source and drain are interchangeable. A plurality of tunneling lines 22 including tunneling lines 22-1, 22-2 and 22-3 are provided. Each of the tunneling lines 22 extends in the Y-axis direction; that is, extends in the same direction as the bit lines $6_L$. The tunneling lines 22-1, 22-2 and 22-3 electrically couple the tunneling gates 82-1, 82-2 and 82-3 of memory cells 20. The tunneling lines 22-1, 22-2 and 22-3 extend in the tunneling line orientation, that is, the Y-axis direction.

Figure 8D:
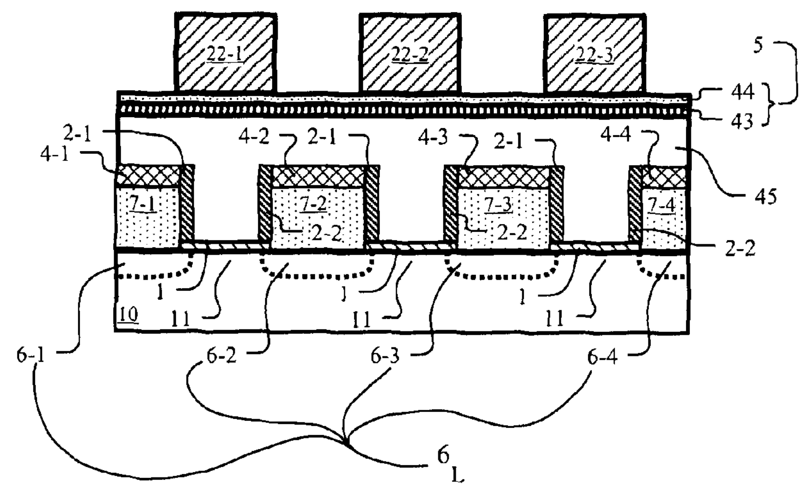
FIG. 8D depicts a cross-sectional view of the memory array of FIG. 7 along section line DD'.

FIG. 8D depicts a cross-sectional view of the memory array of FIG. 7 along section line DD'.

The various embodiments in this specification have demonstrated memory cells 20 and memory arrays 30, 40 and 80 that are manufactured using simple processing steps. The bit line $6_L$ resistances are reduced significantly without using heavily doped and/or deep bit line diffusions. The memory cells 20 and memory arrays 30, 40 and 80 of FIG. 3, FIG. 4 and FIG. 7, respectively, are scalable with technology nodes of different sizes.

While the invention has been particularly shown and described with reference to preferred embodiments thereof it will be understood by those skilled in the art that various changes in arrangement and details may be made therein without departing from the scope of the invention.

What is claimed is:

1. A semiconductor memory cell array comprising a plurality of memory cells, each memory cell including:

a first element, a second element and a channel between the first element and the second element in a body, a charge storage region juxtaposed the channel, the first element and the second element extending in a first direction through the plurality of memory cells:

an element conductor juxtaposed the first element and extending in the first direction through the plurality of memory cells continuously coupling to the first element;

a line conductor juxtaposed the charge storage region and extending in a second direction normal to the first direction; and a line insulator for insulating the element conductor from the line conductor.

2. The semiconductor memory cell array of claim 1, wherein the charge storage region comprises polysilicon.

3. The semiconductor memory cell array of claim 1, wherein the charge storage region has a height in a range from approximately 10 nanometers to approximately 120 nanometers.

4. The semiconductor memory cell array of claim 1, wherein the charge storage region comprises a plurality of spaced-apart nanoparticles.

5. The semiconductor memory cell array of claim 4, wherein the nanoparticles comprise material selected from the group consisting of Si, Ge, $HfO_2$, Au, Ag, Pt, combinations thereof, and alloys thereof.

6. The semiconductor memory cell array of claim 4, wherein the nanoparticles include nanoparticles having diameters in a range from approximately 5 nanometers to approximately 20 nanometers.

7. The semiconductor memory cell array of claim 1, wherein the charge storage region comprises a dielectric having a plurality of trapping centers.

8. The semiconductor memory cell array of claim 7, wherein the dielectric comprises material selected from the group consisting of silicon nitride (SiN), hafnium oxide ($HfO_2$), oxynitride, combinations thereof, and alloys thereof.

9. The semiconductor memory cell array of claim 1, each memory cell further including:

a channel insulator between the channel and the charge storage region.

10. The semiconductor memory cell array of claim 1, each memory cell further including:

an element conductor insulator between the element conductor and the charge storage region.

11. The semiconductor memory cell array of claim 1, each memory cell further including:

a line conductor insulator between the line conductor and the charge storage region.

12. The semiconductor memory cell array of claim 1, each memory cell further including:

a first insulator between the channel and the charge storage region;

a second insulator between the element conductor and the charge storage region; and a third insulator between the line conductor and the charge storage region.

13. The semiconductor memory cell array of claim 12, wherein two or more of the first insulator, the second insulator, and the third insulator are formed of the same material.

14. The semiconductor memory cell array of claim 12, wherein one or more of the first insulator, the second insulator, and the third insulator are formed of one or more layers of insulating material.

15. The semiconductor memory cell array of claim 12, wherein one or more of the first insulator, the second insulator, and the third insulator are formed of one or more layers of material selected from the group consisting of oxide, nitride, oxynitride, combinations thereof, and alloys thereof.

16. The semiconductor memory cell array of claim 12, wherein the first insulator, the second insulator, and the third insulator are each formed of one or more layers of materials haying a thickness in a range from approximately 1 nanometer to approximately 20 nanometers.

17. The semiconductor memory array of claim 1, wherein the line insulator has a thickness in a range from approximately 5 nanometers to approximately 50 nanometers.

18. The semiconductor memory array of claim 1, wherein the element conductor has a thickness in a range from approximately 20 to approximately 200 nanometers.

19. The semiconductor memory cell array of claim 1, wherein the element conductor is a semiconductor having a doping level in a range from approximately $1\times10^{19}$ atoms/$cm^3$ to approximately $1\times10^{21}$ atoms/$cm^3$.

20. The semiconductor memory cell array of claim 1, wherein the element conductor has a sheet resistance in a range from approximately 1 ohm/square to approximately 200 ohms/square.

21. The semiconductor memory cell array of claim 1, wherein the element conductor is a material selected from the group consisting of polysilicon, amorphous silicon, polysilicon germanium, amorphous silicon germanium, metal, combinations thereof, and alloys thereof.

22. The semiconductor memory cell array of claim 1, wherein a length of the channel is less than about 130 nanometers.

23. The semiconductor memory cell array of claim 1, wherein the first element and the second element are semiconductor elements having doping levels in a range from approximately $5\times10^{18}$ atoms/$cm^3$ to approximately $5\times10^{19}$ atoms/$cm^3$.

24. The semiconductor memory cell array of claim 1, wherein the first element and the second element have depths into the body in a range from approximately 5 nanometers to approximately 200 nanometers.

25. The semiconductor memory cell array of claim 1, wherein the first element and the second element have sheet resistances of greater than approximately 80 ohms/square.

26. The semiconductor memory cell array of claim 1, wherein a conductivity of the first element is substantially less than the conductivity of the element conductor whereby a first combined conductivity of the first element and the element conductor is substantially greater than the conductivity of the first element.

27. The semiconductor memory cell array of claim 1, each memory cell further including:

a tunneling gate in proximity to the line conductor and juxtaposed the charge storage region; and a gate insulator between the tunneling gate and the line conductor.

28. The semiconductor memory cell array of claim 27, wherein the gate insulator is a filter.

29. The semiconductor memory cell array of claim 28, wherein the filter includes multiple layers, each layer comprising material selected from the group consisting of oxide, nitride, oxynitride, $Al_2O_3$, $HfO_2$, $TiO_2$, $ZrO_2$, $Ta_2O_5$, combinations thereof, and alloys thereof.

30. The semiconductor memory cell array of claim 28, wherein the filter includes a first layer formed of oxide and a second layer formed of material selected from the group consisting of nitride, oxynitride, $Al_2O_3$, $HfO_2$, $TiO_2$, $ZrO_2$, $Ta_2O_5$, combinations thereof, and alloys thereof.

31. The semiconductor memory cell array of claim 28, wherein the filter includes a first layer formed of oxynitride and a second layer formed, of material selected from the group consisting of nitride, $Al_2O_3$, $HfO_2$, $TiO_2$, $ZrO_2$, $Ta_2O_5$, combinations thereof and alloys thereof.

32. A memory array including a plurality of memory cells extending in a first direction and in a second direction, each memory cell including:

a first element, a second element and a channel between the first element and the second element in a body;

a charge storage region juxtaposed the channel;

a first element conductor and a second element conductor in contact with the first element and the second element, respectively;

a line conductor juxtaposed the charge storage region; and line insulators for insulating the element conductors from the line conductors, wherein the line conductor extends to a first plurality of the memory cells in the first direction so as to be juxtaposed the charge storage regions in each of the plurality of memory cells; and wherein the first element and the second element, and the first element conductor and the second element conductor, from one memory cell extend to another memory cell, whereby the first element and the first element conductor, and the second element and the second element conductor, respectively, are in contact in the plurality of memory cells.

33. The memory array of claim 32, wherein:

a conductivity of the first element is substantially less than a conductivity of the first element conductor whereby a combined conductivity of the first element and the first element conductor is substantially greater than the conductivity of the first element; and a conductivity of the second element is substantially less than a conductivity of the second element conductor whereby a combined conductivity of the second element and the second element conductor is substantially greater than the conductivity of the second element.

34. The memory array of claim 32, each memory cell further including:

a tunneling gate in proximity to the line conductor and juxtaposed the charge storage region; and a gate insulator between the tunneling gate and the line conductor.

35. The memory array of claim 34, wherein the gate insulator is a filter.

36. The memory array of claim 35, wherein the filter includes multiple layers, each layer comprising material selected from the group consisting of oxide, nitride oxynitride, $Al_2O_3$, $HfO_2$, $TiO_2$, $ZrO_2$, $Ta_2O_5$, combinations thereof, and alloys thereof.

* * * * *